United States Patent
Nakamura

(10) Patent No.: US 11,895,891 B2
(45) Date of Patent: Feb. 6, 2024

(54) DISPLAY DEVICE

(71) Applicant: SHARP KABUSHIKI KAISHA, Sakai (JP)

(72) Inventor: Kohzoh Nakamura, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 536 days.

(21) Appl. No.: 17/278,610

(22) PCT Filed: Sep. 28, 2018

(86) PCT No.: PCT/JP2018/036451
§ 371 (c)(1),
(2) Date: Mar. 22, 2021

(87) PCT Pub. No.: WO2020/065965
PCT Pub. Date: Apr. 2, 2020

(65) Prior Publication Data
US 2022/0045139 A1  Feb. 10, 2022

(51) Int. Cl.
*H10K 59/35* (2023.01)
*H10K 59/131* (2023.01)

(52) U.S. Cl.
CPC ......... *H10K 59/353* (2023.02); *H10K 59/131* (2023.02)

(58) Field of Classification Search
CPC .................................................. H10K 59/353
USPC ......................................................... 257/40
See application file for complete search history.

(56) References Cited

U.S. PATENT DOCUMENTS

| | | | |
|---|---|---|---|
| 2013/0234917 A1* | 9/2013 | Lee | H10K 59/353 345/82 |
| 2014/0071030 A1 | 3/2014 | Lee | |
| 2015/0362776 A1 | 12/2015 | Jikumaru et al. | |
| 2015/0364075 A1 | 12/2015 | Sato et al. | |
| 2017/0195658 A1 | 7/2017 | Jung | |
| 2018/0069057 A1 | 3/2018 | Lee | |
| 2019/0212780 A1* | 7/2019 | Choi | G09F 9/301 |
| 2019/0333970 A1 | 10/2019 | Lee | |

(Continued)

FOREIGN PATENT DOCUMENTS

| | | |
|---|---|---|
| JP | 2013187187 A | 9/2013 |
| JP | 2016001290 A | 1/2016 |

(Continued)

*Primary Examiner* — Ajay Arora
(74) *Attorney, Agent, or Firm* — ScienBiziP, P.C.

(57) ABSTRACT

A display device includes a plurality of subpixels. The plurality of subpixels include a first subpixel including a first light-emitting layer, and a first subpixel circuit, a second subpixel including a second light-emitting layer, and a second subpixel circuit, a third subpixel including a third light-emitting layer, and a third subpixel circuit, and a fourth subpixel including a fourth light-emitting layer, and a fourth subpixel circuit. An area of an opening exposing a first electrode in the first subpixel is larger than an area of the opening exposing the first electrode in each of the second subpixel, the third subpixel, and the fourth subpixel. A plurality of light emission control lines include a first light emission control line connected to the first subpixel circuit and the third subpixel circuit, and a second emission control line connected to the second subpixel circuit and the fourth subpixel circuit.

10 Claims, 8 Drawing Sheets

(56) References Cited

U.S. PATENT DOCUMENTS

2019/0363310 A1\* 11/2019 Nakamura ............. H10K 71/00
2020/0394955 A1 12/2020 Lee

FOREIGN PATENT DOCUMENTS

| JP | 2016001294 A | 1/2016 |
| JP | 2016027374 A | 2/2016 |
| JP | 2017135697 A | 8/2017 |

\* cited by examiner

DISPLAY DEVICE

TECHNICAL FIELD

The disclosure relates to a display device.

BACKGROUND ART

PTL 1 discloses an organic EL display in which red, blue, and green subpixels are delta-arranged.

CITATION LIST

Patent Literature

PTL 1: JP 2016-1294 A (published on Jan. 7, 2016)

SUMMARY

Technical Problem

In the configuration of PTL 1, blue subpixels are thinned out, and thus there is a problem in that a current density of the blue light-emitting layer increases and deterioration tends to occur over time.

Solution to Problem

A display device according to an aspect of the disclosure is a display device including a plurality of subpixels each formed to have a light-emitting layer that is island-shaped, in which each of the plurality of subpixels has a first electrode, a cover film having an opening exposing the first electrode, the light-emitting layer, a second electrode, and a corresponding one of a plurality of subpixel circuits provided at intersection points of a plurality of data lines, a plurality of scanning signal lines, and a plurality of light emission control lines, the second electrode is common to a plurality of the first electrodes, the subpixel includes a first subpixel including a first light-emitting layer, which is island-shaped, and a first subpixel circuit corresponding to the first light-emitting layer, a second subpixel including a second light-emitting layer, which is island-shaped, and a second subpixel circuit corresponding to the second light-emitting layer, a third subpixel including a third light-emitting layer, which is island-shaped, and a third subpixel circuit corresponding to the third light-emitting layer, and a fourth subpixel including a fourth light-emitting layer, which is island-shaped, and a fourth subpixel circuit corresponding to the fourth light-emitting layer, the first light-emitting layer and the second light-emitting layer are adjacent to each other in a column direction, the third light-emitting layer and the fourth light-emitting layer are adjacent to each other in the column direction, and the third light-emitting layer and the fourth light-emitting layer are adjacent to the first light-emitting layer and the second light-emitting layer in a diagonal direction, the third light-emitting layer and the fourth light-emitting layer have an identical light emission color, an area of the opening exposing the first electrode in the first subpixel is larger than an area of the opening exposing the first electrode in each of the second subpixel, the third subpixel, and the fourth subpixel, and the plurality of light emission control lines include a first light emission control line connected to the first subpixel circuit and the third subpixel circuit, and a second light emission control line adjacent to the first light emission control line and connected to the second subpixel circuit and the fourth subpixel circuit.

Advantageous Effects of Disclosure

According to an aspect of the disclosure, it is possible to suppress deterioration over time of a specific light-emitting layer.

DESCRIPTION OF EMBODIMENTS

Figure 1:
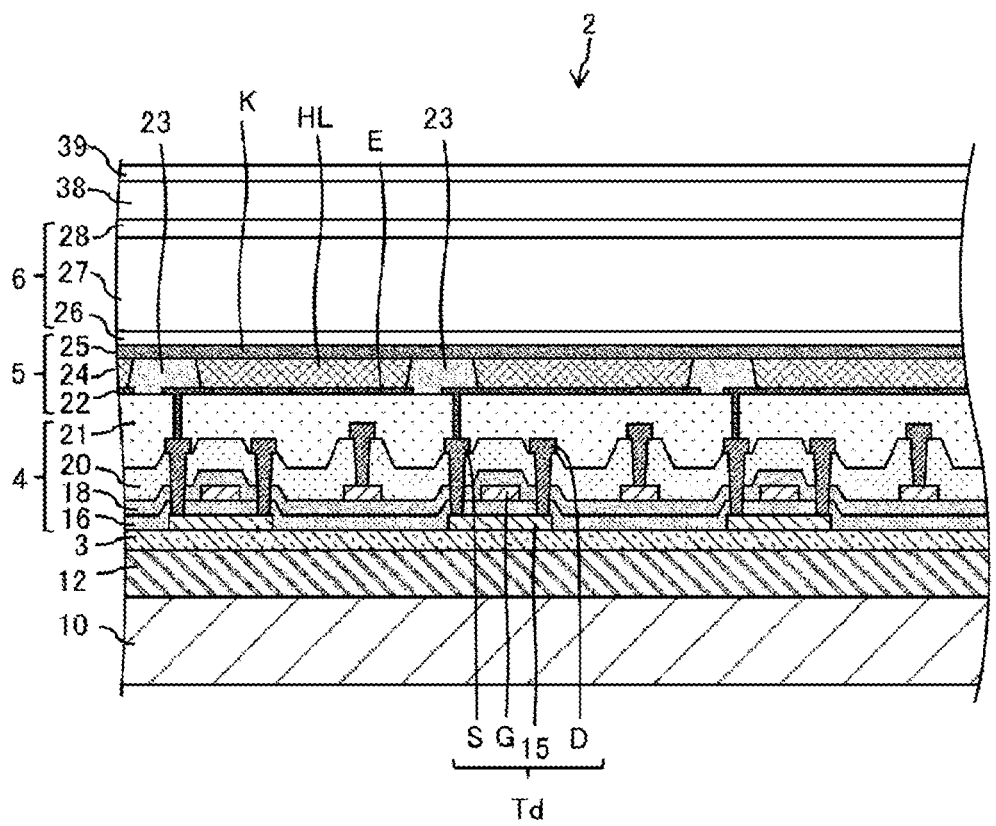
FIG. 1 is a cross-sectional view illustrating a configuration example of a display device.

FIG. 1 is a cross-sectional view illustrating a configuration example of a display device. A display device 2 in FIG. 1 is of a top-emitting type that emits light upward, and includes a base material 10, a resin layer 12, a barrier layer 3 (undercoat layer), a TFT layer 4, a light-emitting element layer 5, a sealing layer 6, an adhesive layer 38, and a function film 39 in this order from a lower side.

An example of the material of the base material 10 includes polyethylene terephthalate (PET). Examples of the material of the resin layer 12 include polyimide, epoxy, polyamide, and the like.

The barrier layer 3 is a layer for preventing moisture and impurities from reaching the TFT layer 4 and the light-emitting element layer 5 during usage of the display device. The barrier layer 3 may be constituted by, for example, a silicon oxide film, a silicon nitride film, or a silicon oxynitride film, which are formed by CVD, or a layered film thereof.

The TFT layer 4 includes a semiconductor film 15, an inorganic insulating film 16, a gate electrode G, an inorganic insulating film 18, a capacitance wiring C, an inorganic insulating film 20, a source electrode S and a drain electrode D, and a flattening film 21 which are layered in that order from the bottom.

A thin film transistor (light emission control transistor Td) is configured to include the semiconductor film 15, the inorganic insulating film 16 (gate insulating film), and the gate electrode G. The source electrode S is connected to a source region of the semiconductor film 15, and the drain electrode D is connected to a drain region of the semiconductor film 15.

The semiconductor film 15 is constituted by, for example, low-temperature polysilicon (LTPS) or an oxide semiconductor. Note that, although a TFT including the semiconductor film 15 as a channel is illustrated as having a top gate structure in FIG. 2, the TFT may have a bottom gate structure (for example, a case where the channel of the TFT is an oxide semiconductor).

Each of the inorganic insulating films 16, 18, and 20 can be constituted by, for example, a silicon oxide (SiOx) film or a silicon nitride (SiNx) film, which are formed by a CVD method, or a layered film thereof.

The flattening film (interlayer insulating film) 21 can be constituted by a coatable photosensitive organic material such as a polyimide or an acrylic.

The gate electrode G, the source electrode S, and the drain electrode D contain at least one of, for example, aluminum (Al), tungsten (W), molybdenum (Mo), tantalum (Ta), chromium (Cr), titanium (Ti), and copper (Cu). In addition, the gate electrode G, the source electrode S. and the drain electrode D are constituted by a single-layer film or a layered film of a metal.

The light-emitting element layer 5 (for example, an organic light-emitting diode layer) includes a lower electrode layer 22 formed on the flattening film 21, a cover film 23 in an upper layer overlying the lower electrode layer 22, a light-emitting layer HL in an upper layer overlying the cover film 23, and an upper electrode layer 25 in an upper layer overlying the light-emitting layer HL. Further, in the light-emitting element layer 5, a light-emitting element (for example, an organic light-emitting diode: OLED) is configured to include an anode (anode electrode) E (first electrode) of the lower electrode layer 22, the light-emitting layer HL, and a cathode (cathode electrode) K (second electrode) of the upper electrode layer 25. The cover film 23 is a coatable photosensitive organic material such as a polyimide, an epoxy, or an acrylic, and is patterned to cover an edge of the anode E.

The light-emitting layer HL is formed to overlap an opening of the cover film 23 by vapor deposition or an ink-jet method, and an overlapping region of the opening of the cover film 23 (exposed face of the anode E) and the light-emitting layer HL is a light-emitting region of a subpixel. In other words, the area of the opening of the cover film 23 that exposes the anode E in a certain subpixel is a light-emitting region of the subpixel. In the case where the light-emitting element layer 5 is an organic light-emitting diode (OLED) layer, for example, a hole injecting layer, a hole transport layer, the light-emitting layer HL, an electron transport layer, and an electron injecting layer are layered on the exposed face of the anode E, but only the light-emitting layer HL is illustrated here.

The anode E is light-reflective and is constituted by layering, for example, indium tin oxide (ITO) and an alloy containing Ag. The cathode K can be constituted by a transparent conductive material such as a MgAg alloy (a very thin film), indium tin oxide (ITO), or indium zinc oxide (IZO).

In the case where the light-emitting element layer 5 is an OLED layer, holes and electrons are recombined inside the light-emitting layer HL by a drive current between the anode E and the cathode K, and thus light is emitted as a result of excitons, which are generated by the recombination, falling into a ground state. Since the cathode K is transparent and the anode E is light-reflective, light emitted from the light-emitting layer HL travels upwards and results in top emission.

The light-emitting element layer 5 is not only limited to constituting the OLED element, but may also constitute an inorganic light-emitting diode or a quantum dot light-emitting diode.

The sealing layer 6 is transparent, and includes an inorganic sealing film 26, which covers the upper electrode layer 25, the organic sealing film 27 formed in an upper layer overlying the inorganic sealing film 26, and an inorganic sealing film 28, which covers the organic sealing film 27. Each of the inorganic sealing films 26 and 28 can be constituted by, for example, a silicon oxide film, a silicon nitride film, a silicon oxynitride film, which are formed by CVD using a mask, or a layered film thereof. The organic sealing film 27 is a transparent organic film thicker than the inorganic sealing films 26 and 28, and can be formed of a coatable organic material such as an acrylic. For example, ink containing such an organic material is applied to the inorganic sealing film 26 by an ink-jet method, and is then cured by UV irradiation. The sealing layer 6 covers the light-emitting element layer 5 and prevents foreign matter, such as water and oxygen, from infiltrating into the light-emitting element layer 5.

The function film 39 has, for example, an optical compensation function, a touch sensor function, a protection function, or the like.

First Embodiment

Hereinafter, for ease of description, a vertical direction in the drawing is referred to as a column direction, a horizontal direction in the drawing is referred to as a row direction, and a diagonal direction is based on the row direction and the column direction. Note that, for example, the row direction may have a parallel relationship, an orthogonal relationship, or a diagonal relationship with one edge (one side) of the display device. Further, a subpixel is the smallest display component independently driven. A pixel is a subpixel group corresponding to one set of input signals (R signal, G signal, and B signal).

Figure 2:
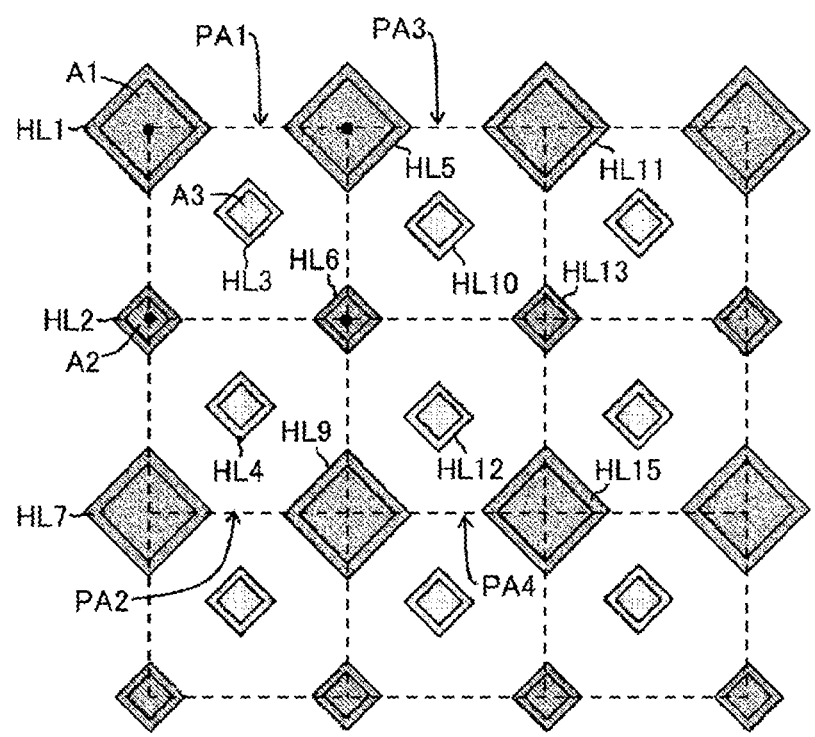
FIG. 2 is a plan view illustrating an arrangement of a light-emitting layer and a light-emitting region according to a first embodiment.

FIG. 2 is a plan view illustrating an arrangement of light-emitting layers and light-emitting regions according to the first embodiment. In the display device according to the first embodiment, a light-emitting layer HL1 (a first light-emitting layer) of blue light emission, a light-emitting layer HL2 of red light emission (a second light-emitting layer), and a light-emitting layer HL7 of blue light emission are arranged in that order in the column direction. Furthermore, a light-emitting layer HL5 of blue light emission, a light-emitting layer HL6 of red light emission, and a light-emitting layer HL9 of blue light emission are arranged in that order in the column direction. Furthermore, a light-emitting layer HL11 of blue light emission, a light-emitting layer HL13 of red light emission, and a light-emitting layer HL15 of blue light emission are arranged in that order in the column direction.

On the other hand, the light-emitting layer HL1, the light-emitting layer HL5, and the light-emitting layer HL11 are arranged in that order in the row direction. In addition, the light-emitting layer HL2, the light-emitting layer HL6, and the light-emitting layer HL13 are arranged in that order in the row direction. Furthermore, the light-emitting layer HL7, the light-emitting layer HL9, and the light-emitting layer HL15 are arranged in that order in the row direction.

A light-emitting layer HL3 of green light emission (a third light-emitting layer) is adjacent to each of the light-emitting layer HL1, the light-emitting layer HL2, the light-emitting layer HL5, and the light-emitting layer HL6 in the diagonal direction. The light-emitting layer HL4 of green light emission (a fourth light-emitting layer) is adjacent to each of the light-emitting layer HL2, the light-emitting layer HL6, the light-emitting layer HL7, and the light-emitting layer HL9 in the diagonal direction. A light-emitting layer HL10 of green light emission is adjacent to each of the light-emitting layer HL5, the light-emitting layer HL6, the light-emitting layer HL11, and the light-emitting layer HL13 in the diagonal direction. A light-emitting layer HL12 of green light emission is adjacent to each of the light-emitting layer HL6, the light-emitting layer HL9, the light-emitting layer HL13, and the light-emitting layer HL15 in the diagonal direction.

When seen in a plan view, square pixel areas are arranged in a matrix, and the centers of the light-emitting layers HL1 (blue), HL2 (red), HL5 (blue), and HL6 (red) are disposed at four vertices of a pixel area PA1, and the center of the light-emitting layer HL3 (green) matches the center of the pixel area PA1. The centers of the light-emitting layers HL2 (red), HL7 (blue), HL6 (red), and HL9 (blue) are disposed at four vertices of a pixel area PA2, and the center of the light-emitting layer HL4 (green) matches the center of the pixel area PA2. The centers of the light-emitting layers HL5 (blue), HL6 (red), HL11 (blue), and HL13 (red) are disposed at four vertices of a pixel area PA3, and the center of the light-emitting layer HL10 (green) matches the center of the pixel area PA3. The centers of the light-emitting layers HL6 (red), HL9 (blue), HL13 (red), and HL15 (blue) are disposed at four vertices of a pixel area PA4, and the center of the light-emitting layer HL12 (green) matches the center of the pixel area PA4.

Each of the light-emitting layers has an island shape overlapping one anode, and a square shape (rhombic shape) having two diagonal lines in a row direction and two diagonal lines in a column direction when seen in a plan view. Note that the light-emitting layers of red light emission (HL2, HL6, and the like) and the light-emitting layers of green light emission (HL3, HL4, and the like) have substantially the same sizes. In addition, the light-emitting layers of blue light emission (HL1, HL5, HL7, and the like) have sizes larger than those of the light-emitting layers of red light emission (HL2, HL6, and the like) and the light-emitting layers of green light emission (HL3, HL4, and the like).

Figure 3:
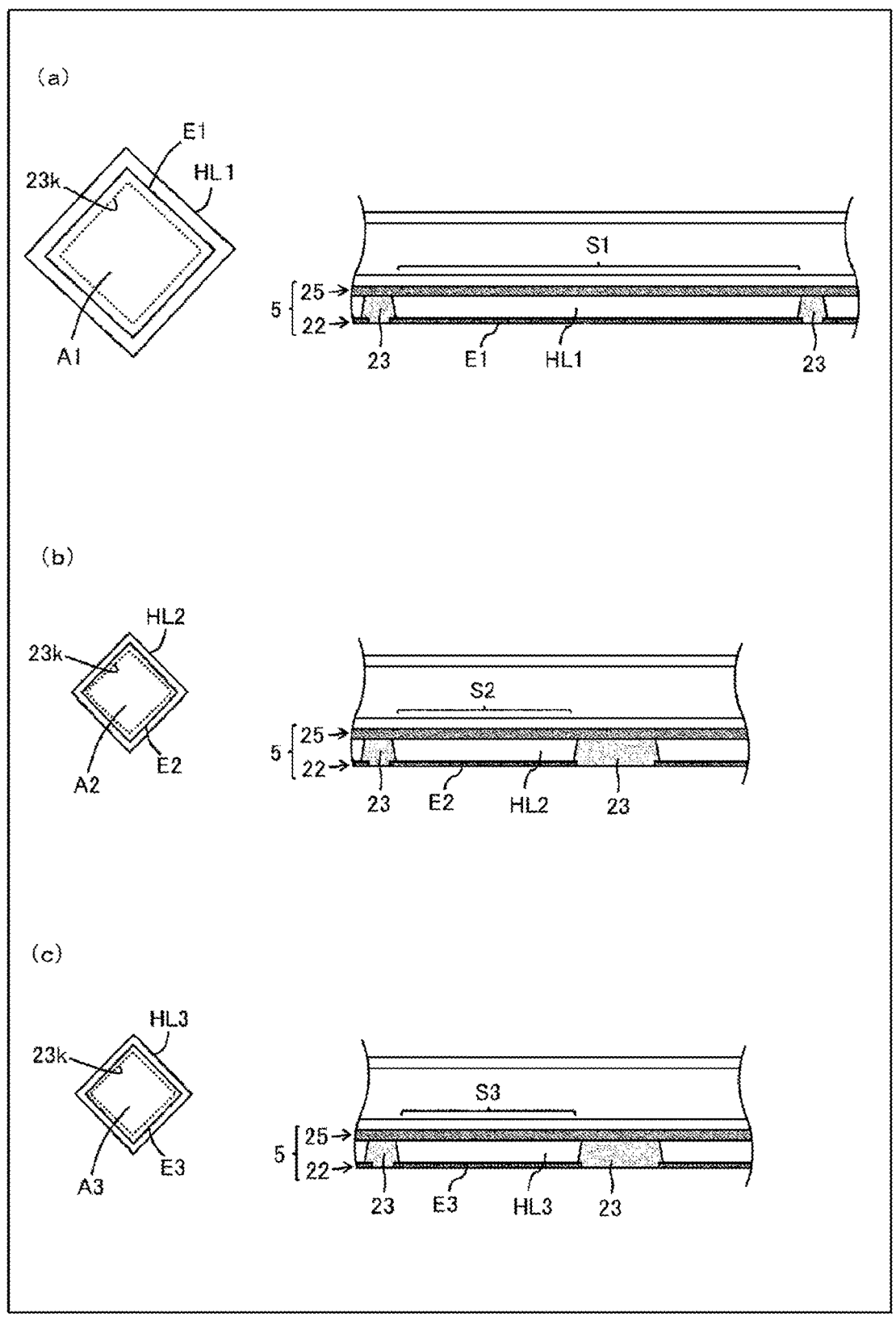
FIG. 3 is a plan view and a cross-sectional view illustrating a subpixel according to the first embodiment.

(a) of FIG. 3 is a plan view and a cross-sectional view illustrating a subpixel S1 (first subpixel), (b) of FIG. 3 is a plan view and a cross-sectional view illustrating a subpixel S2 (second subpixel), and (c) of FIG. 3 is a plan view and a cross-sectional view illustrating a subpixel S3 (third subpixel).

The light-emitting layer HL1 of blue light emission overlaps one anode E1. When seen in a plan view, the anode E1 has a square shape (rhombic shape) having two diagonal lines in the row direction and two diagonal lines in the column direction, and is disposed within an edge of the light-emitting layer HL1. The edge of the anode E1 is covered with the cover film 23, and a region overlapping an exposed portion of the anode E1 (a downward portion of an opening 23k of the cover film) in the light-emitting layer HL1 is a light-emitting region A1. A blue subpixel S1 is formed to include the anode E1 and the light-emitting region A1 of the light-emitting layer HL1.

The light-emitting layer HL2 of red light emission overlaps one anode E2. When seen in a plan view, the anode E2 has a square shape (rhombic shape) having two diagonal lines in the row direction and two diagonal lines in the column direction, and is arranged within an edge of the light-emitting layer HL2. The edge of the anode E2 is covered with the cover film 23, and a region overlapping an exposed portion of the anode E2 (a downward portion of the opening 23k of the cover film) in the light-emitting layer HL2 is a light-emitting region A2. A red subpixel S2 is formed to include the anode E2 and the light-emitting region A2 of the light-emitting layer HL2.

The light-emitting layer HL3 of green light emission overlaps one anode E3. When seen in a plan view, the anode E3 has a square shape (rhombic shape) having two diagonal lines in the row direction and two diagonal lines in the column direction, and is disposed within an edge of the light-emitting layer HL3. The edge of the anode E3 is covered with the cover film 23, and a region overlapping an exposed portion of the anode E3 (a downward portion of the opening 23k of the cover film) in the light-emitting layer HL3 is a light-emitting region A3. A green subpixel S3 is formed to include the anode E3 and the light-emitting region A3 of the light-emitting layer HL3. Note that the green subpixel S4 (fourth subpixel) may also have the same configuration as the subpixel S3.

Each of the light-emitting regions A1, A2, and A3 has a square shape (rhombus shape) having two diagonal lines in the row direction and two diagonal lines in the column direction, the light-emitting regions A2 and A3 (red and green) have the same size, and the light-emitting region A1 (blue) is larger than the light-emitting regions A2 and A3.

Figure 4:
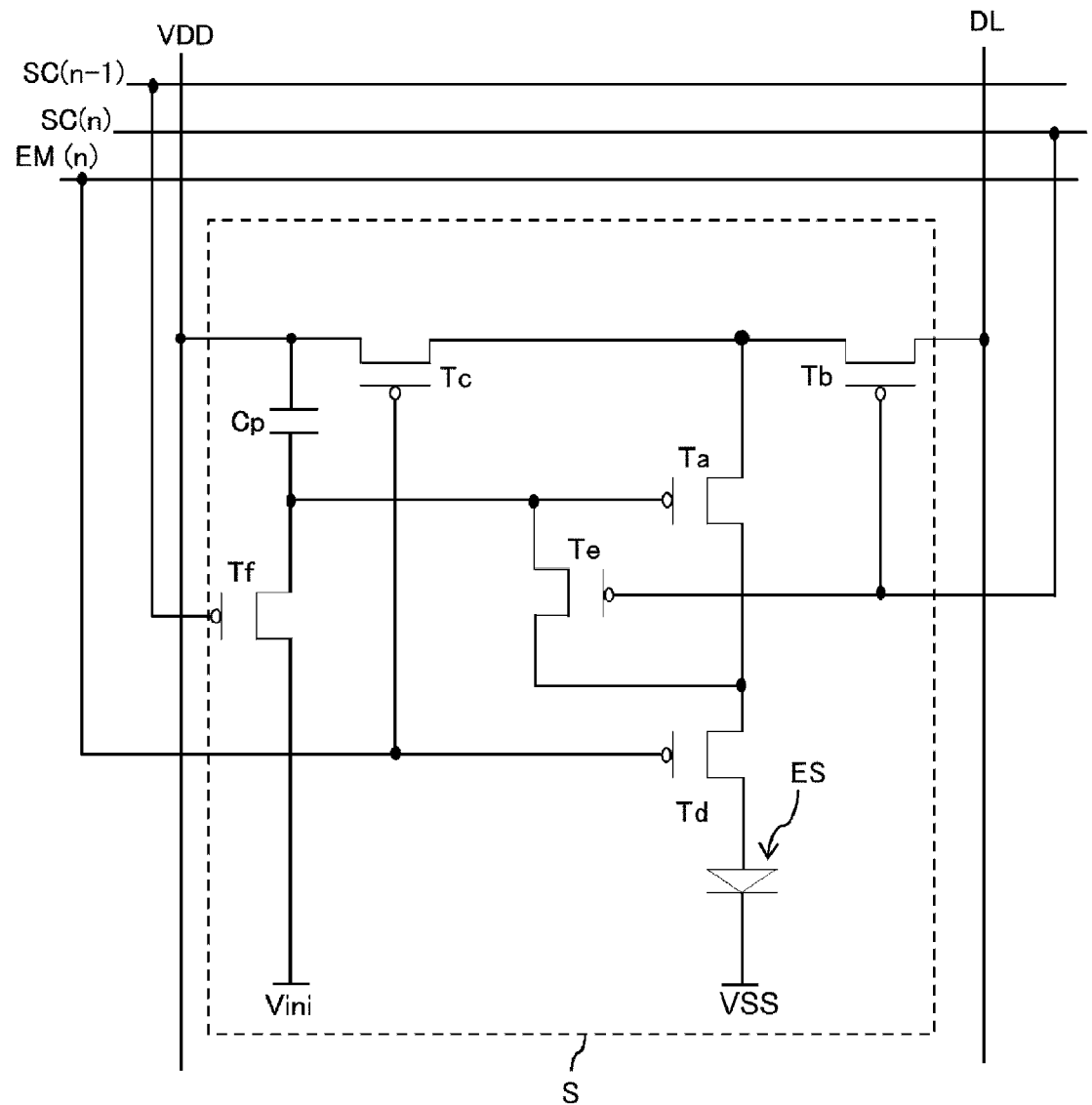
FIG. 4 is a circuit diagram illustrating a configuration example of a subpixel.

FIG. 4 is a circuit diagram illustrating a configuration example of a subpixel. The TFT layer 4 is provided with a plurality of data lines DL extending in the column direction, a plurality of scanning lines SC(n) and a plurality of light emission control lines EM(n) extending in the row direction, and subpixels S are connected to the data lines DL and the scanning lines SC(n). Note that a high-level power source VDD and a low-level power source VSS for driving the organic EL element, and an initialization voltage Vini are supplied to the subpixels S. During a period in which the scanning line SC(n) is active, a potential signal corresponding to display gray scale data is supplied from the data line DL to each of the subpixels connected thereto.

Each of the subpixels S includes a subpixel circuit formed in the TFT layer 4 in FIG. 1, and a light emitting element ES (for example, an organic light-emitting diode) formed in the light-emitting element layer 5 in FIG. 1 and including an anode E and a light-emitting layer HL. The subpixel circuit includes a drive transistor Ta, a switch transistor Tb, a power supply control transistor Tc, a light emission control transistor Td, a threshold voltage compensation transistor Te, an initialization transistor Tf, and a capacitor Cp. In other words, the subpixels S1, S2, S3, and S4 respectively include light-emitting layers HL1, HL2, HL3, and HL4, and first, second, third, and fourth subpixel circuits corresponding to the respective light-emitting layers.

Regarding the drive transistor Ta, a gate electrode is connected to a source electrode of the threshold voltage compensation transistor Te, a drain electrode of the initialization transistor Tf, and one electrode of the capacitor Cp. In addition, a drain electrode is connected to a source electrode of the switch transistor Tb and a source electrode of the power supply control transistor Tc, and a source electrode is connected to a drain electrode of the light emission control transistor Td and a drain electrode of the threshold voltage compensation transistor Te.

Regarding the switch transistor Tb, a gate electrode is connected to the scanning line SC(n) of the n-th row, a drain electrode is connected to the data line DL, and a source electrode is connected to the drain electrode of the drive transistor Ta and the source electrode of the power supply control transistor Tc. Regarding the power supply control transistor Tc, a gate electrode is connected to the light emission control line EM(n) of the n-th row. In addition, a drain electrode is connected to a supply line of the high-level power source VDD and the other electrode of the capacitor Cp, and a source electrode is connected to the drain electrode of the drive transistor Ta and the source electrode of the switch transistor Tb.

The anode of the light-emitting element ES is connected to the drain electrode of the light emission control transistor Td, and the cathode of the light-emitting element ES is connected to a supply line of the low-level power source VSS.

Figure 5:
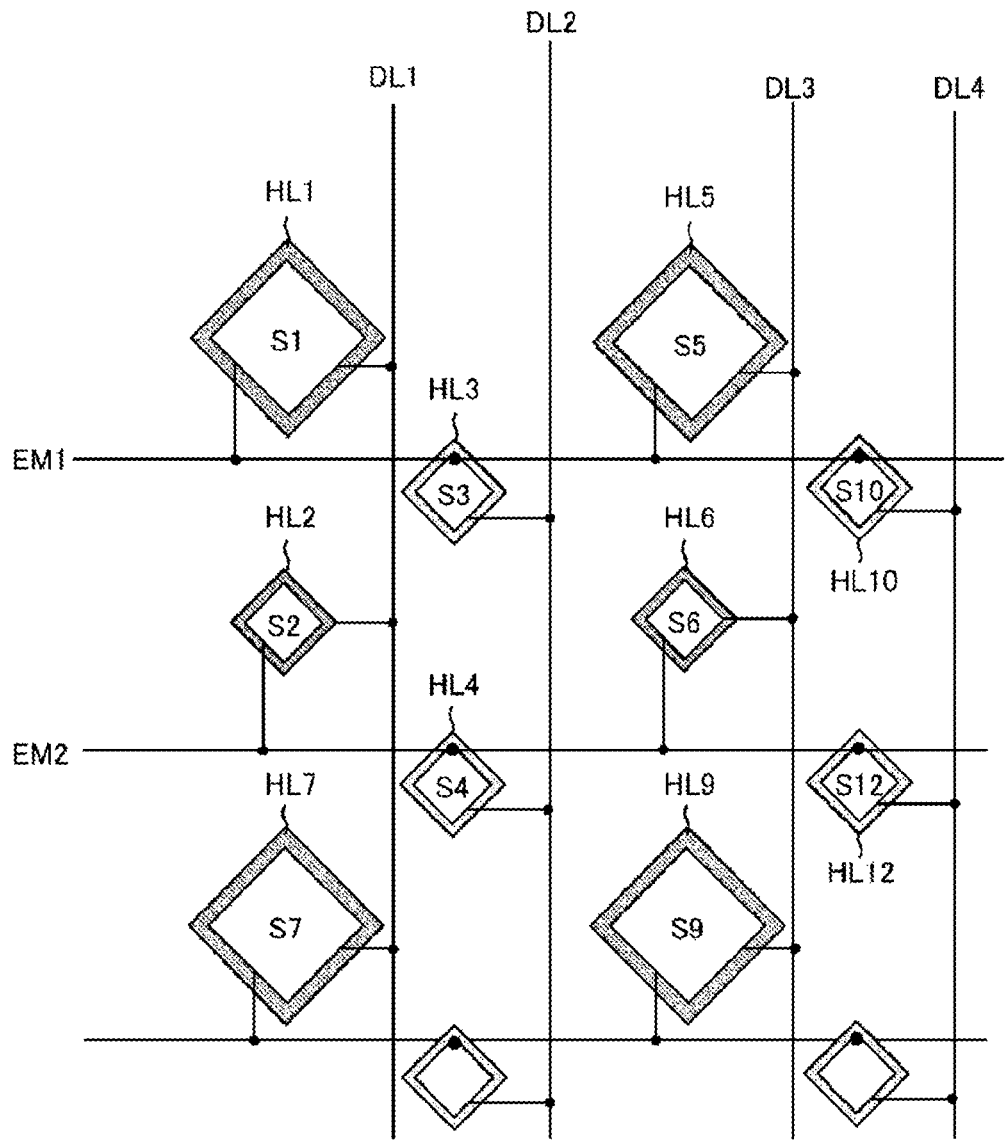
FIG. 5 is a schematic view illustrating a connection relationship between subpixels, light emission control lines, and data lines in the first embodiment.

FIG. 5 is a schematic view illustrating a connection relationship between subpixels, light emission control lines, and data lines in the first embodiment. Similar to the blue subpixel S1 illustrated in FIG. 3, the blue subpixels S5, S7, and S9 have light-emitting layers HL5, HL7 and HL9, respectively. In addition, similar to the red subpixel S2, the red subpixel S6 has a light-emitting layer HL6. Furthermore, similar to the green subpixel S3, the green subpixels S4, S10, and S12 have light-emitting layers HL4, HL10, and HL12, respectively.

The subpixels S1, S2, and S7 are connected to a first data line DL1, the subpixels S3 and S4 are connected to a second data line DL2, the subpixels S5, S6, and S9 are connected to a third data line DL3, and the subpixels S10 and S12 are connected to a fourth data line DL4. Further, the subpixels S1, S3, S5, and S10 are connected to a first light emission control line EM1, and the subpixels S2, S4, S6, and S12 are connected to a second light emission control line EM2. Note that an SPR ratio (the number of subpixels per pixel/3) is ⅔.

According to the first embodiment, it is possible to enlarge light-emitting regions of the light-emitting layers HL1 and HL5 while suppressing vapor deposition defects given an equivalent of two light-emitting layers formed in one pixel area (0.5 light-emitting layers HL1 and HL5, 0.5 light-emitting layers HL2 and HL4, and 1 light-emitting layer HL3). For this reason, it is possible to reduce deterioration of a light-emitting layer in a specific subpixel, such as in the case of the subpixels S1 and S5.

In particular, in the present embodiment, it is possible to enlarge a light-emitting region of a blue light-emitting layer (which is generally more likely to deteriorate than red and green light-emitting layers). For example, in one pixel area PA1, ¼ of the blue light-emitting layer HL1, ¼ of the blue light-emitting layer HL5, ¼ of the red light-emitting layer HL2, ¼ of the red light-emitting layer HL6, and 1/1 (all) of the green light-emitting layer HL3 are formed. However, the blue light-emitting layers HL1 and HL5 have light-emitting regions larger than the light-emitting regions of the red light-emitting layers HL2 and HL6 and the green light-emitting layers HL3 and HL4, and a luminance per unit area can be decreased (a current density can be decreased), whereby it is possible to suppress deterioration of the blue light-emitting layer.

Note that, in the present embodiment, it is possible to reduce so-called black floating in which only subpixels emit light in a floating manner in black display or the like in the subpixels S1 and S5 having a large light-emitting region. The black floating will be described below in detail.

In the driving of a subpixel circuit in the present embodiment, a constant electric charge is charged between the anode and the cathode of the light-emitting element ES due to a potential difference between the anode of the light-emitting element ES and the low-level power source VSS immediately before the light emission control transistor Td is set to be in an ON state. Here, when the light emission control transistor Td is set to be in an ON state, the potential of the anode described above is increased from a capacity ratio between a source side and a drain side of the light emission control transistor Td. Thus, a forward voltage is applied to the light-emitting element ES, and unexpected light emission may occur due to the amount of electric charge charged in the anode.

As illustrated in FIG. 3, the anode E1 formed in the subpixel S1 having a large light-emitting region is formed larger than the anodes E2 and E3 respectively formed in the subpixels S2 and S3. For this reason, the unexpected light emission described above tends to be increased. Thus, when black display is performed, light emission in the subpixel S1 occurs, and black floating may occur. In addition, as in this case, when black floating occurs mainly in a subpixel of a specific color (blue), a display surface is colored blue during black display in addition to a reduction in contrast, and thus the quality of display is further reduced.

In the present embodiment, not only subpixels of the same color such as the subpixels S1 and S5, but also subpixels of different colors such as the subpixels S3 and S10 are connected to the first light emission control line EM1. For this reason, a driving load of the first light emission control line EM1 becomes larger than in a case where a light emission control line is formed for each subpixel color. As a result, a rise in a pulse signal applied to the first light emission control line EM1 is delayed. Thus, a timing at which the light emission control transistor Td is set to be in an ON state is delayed, the unnecessary light emission described above is reduced, and black floating of the subpixel S1 is reduced. In addition, since the same light emission control line is shared by two adjacent rows of subpixels, the number of light emission control lines can be reduced more than when the light emission control lines are formed for each row.

Second Embodiment

Figure 6:
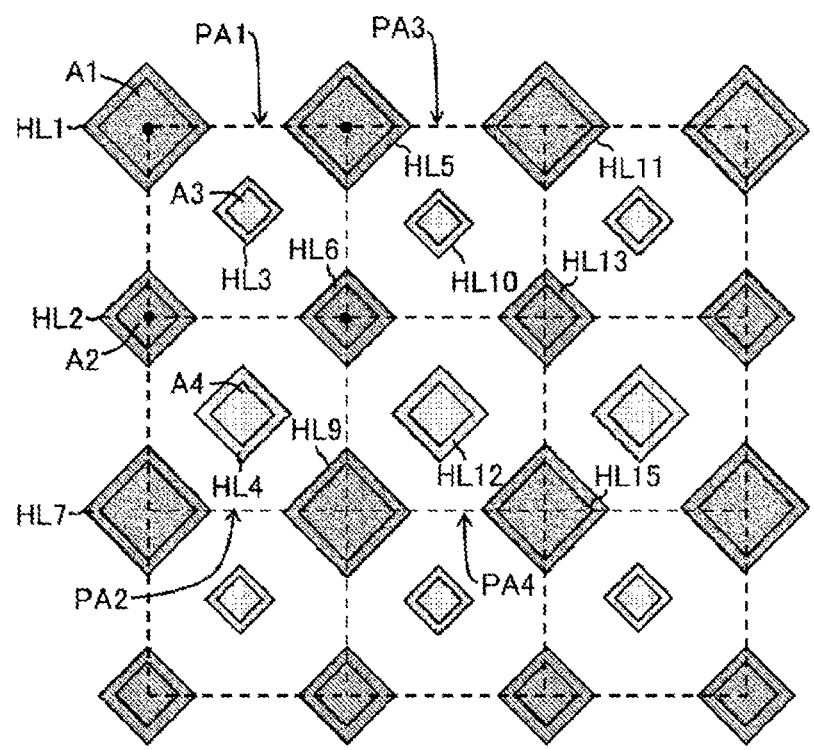
FIG. 6 is a plan view illustrating an arrangement of light-emitting layers and light-emitting regions according to a second embodiment.
Figure 7:
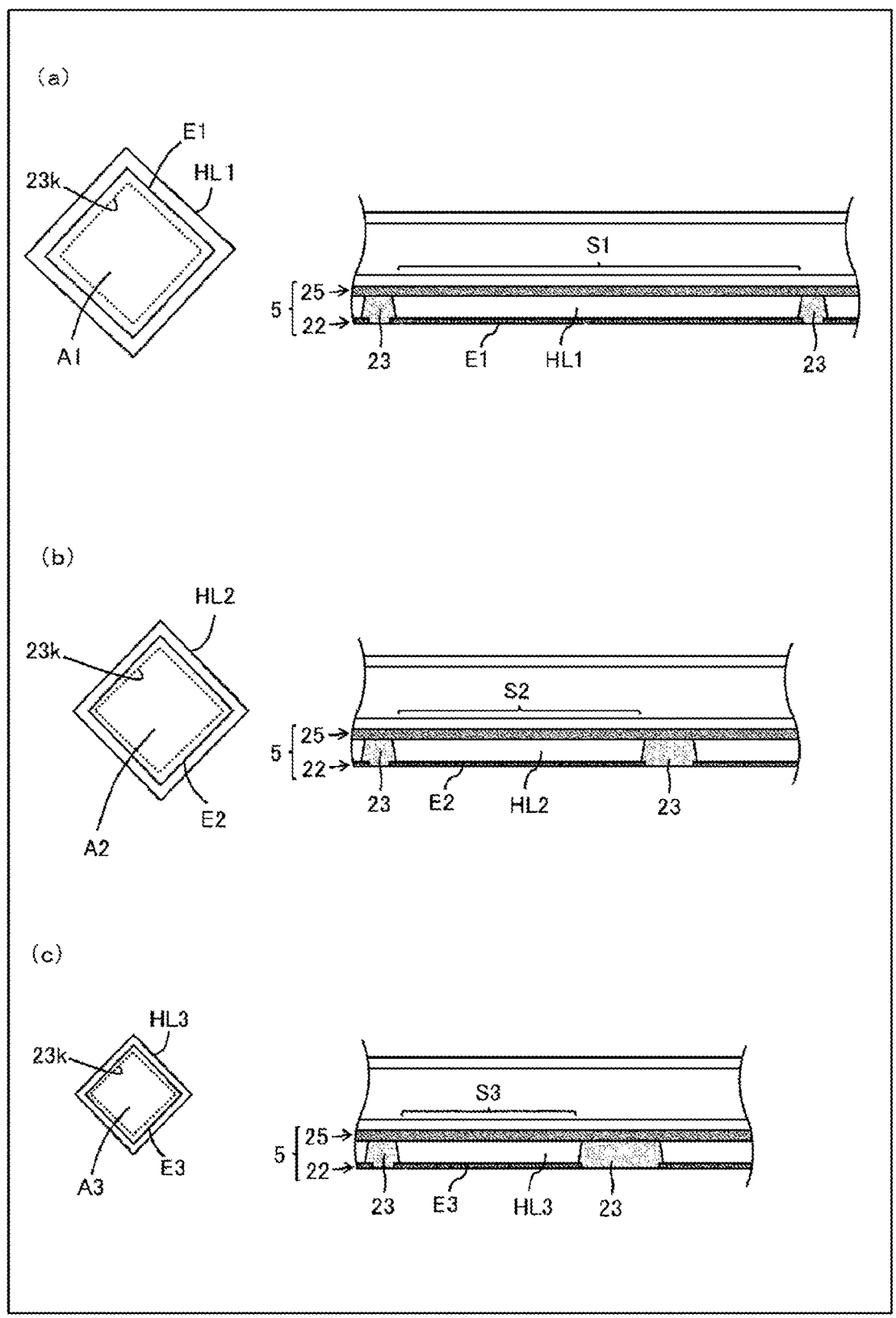
FIG. 7 is a plan view and a cross-sectional view illustrating a subpixel according to the second embodiment.
Figure 8:
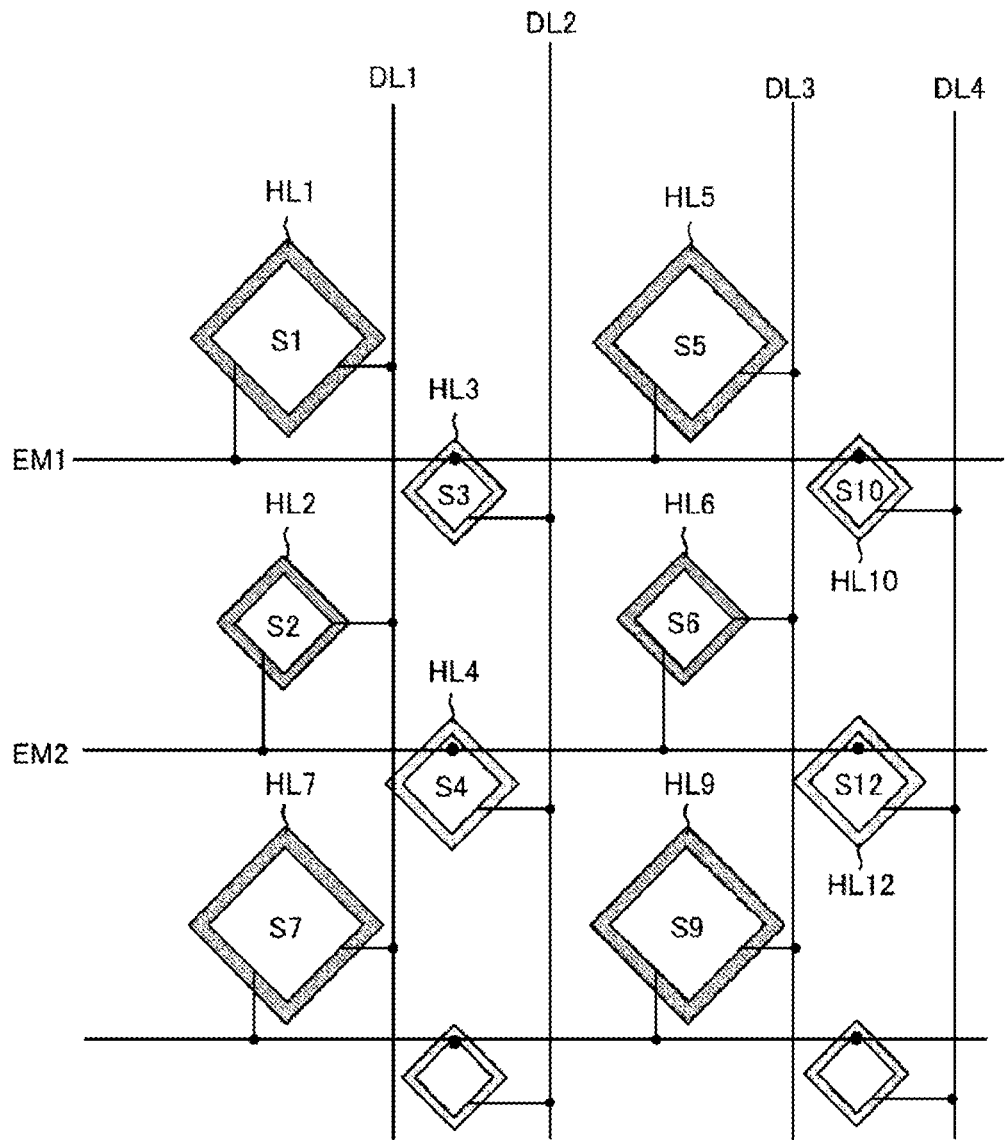
FIG. 8 is a schematic view illustrating a connection relationship between subpixels, light emission control lines, and data lines in the second embodiment.

FIG. 6 is a plan view illustrating an arrangement of a light-emitting layer and an anode of a second embodiment. (a) of FIG. 7 is a plan view and a cross-sectional view illustrating a subpixel S1, (b) of FIG. 7 is a plan view and a cross-sectional view illustrating a subpixel S2, and (c) of FIG. 7 is a plan view and a cross-sectional view illustrating a subpixel S3. FIG. 8 is a schematic view illustrating a connection relationship between subpixels, light emission control lines, and data lines in the second embodiment.

In the first embodiment, the area of the light-emitting region of each of the subpixels S2, S4, S6, and S12 is substantially equal to the area of the light-emitting region of each of the subpixels S3 and S10, but is not limited thereto.

In the present embodiment, the area of the light-emitting region of each of the subpixels S2 and S6 is larger than the area of the light-emitting region of each of the subpixels S3 and S10. In addition, the area of the light-emitting region of each of the subpixels S4 and S12 is larger than the area of the light-emitting region of each of the subpixels S3 and S10. Note that the area of the light-emitting region of each of the subpixels S4 and S12 may be the same as the area of the light-emitting region of each of the subpixels S2 and S6. Except for this point, the display device 2 according to the present embodiment may have the same configuration as that of the display device 2 according to the previous embodiment.

As illustrated in (a) and (c) of FIG. 7, the subpixels S1 and S3 in the present embodiment have the same configurations as those of the subpixels S1 and S3 in the previous embodiment. As illustrated in (b) of FIG. 7, the area of a light-emitting region A2 of the subpixel S2 is smaller than that of a light-emitting region A1 and larger than that of a light-emitting region A3.

In the present embodiment, the areas of the light-emitting regions A2 and A4 of the subpixels S2 and S4 connected to a second light emission control line EM2, which is adjacent to a first light emission control line EM1 connected to the subpixel S1, are relatively large. For this reason, the black floating described above occurs also in the subpixels S2 and S4, and thus a reduction in contrast is suppressed and coloration of a display surface during black display is also reduced as compared to a case where black floating occurs only in the sub-pixel S1.

Note that, in the present embodiment, the area of the light-emitting region A1 is equal to or less than the sum of the areas of the light-emitting regions A2 and A4. In this case, the effect of suppressing a reduction in contrast described above is achieved. More preferably, the sum of the areas of the light-emitting regions A1 and A3 is equal to or less than the sum of the areas of the light-emitting regions A2 and A4. In this case, the effect of suppressing a reduction in contrast described above is further improved.

Further, in the present embodiment, the sum of the areas of the light-emitting regions A1 and A3 may be the same as the sum of the areas of the light-emitting regions A2 and A4. In this case, the sum of the areas of the light-emitting regions of the respective subpixels connected to the same light emission control line is substantially equal, and thus a difference in the black floating described above between the subpixels is reduced, and a reduction in contrast and coloration of a display surface during black display are further suppressed.

An electro-optical element (an electro-optical element whose luminance and transmittance are controlled by an electric current) that is provided in the display devices according to the above-described embodiments is not particularly limited. The display devices according to the above-described embodiments may include, for example, an organic light-emitting diode (OLED) as an electro-optical element. Thus, the display devices according to the above-described embodiments may be, for example, an organic electro luminescent (EL) display including an OLED. In addition, the display devices according to the above-described embodiments may be an inorganic EL display including an inorganic light-emitting diode as an electro-optical element. Further, the display devices according to the above-described embodiments may be a quantum dot light-emitting diode (QLED) display including a QLED as an electro-optical element.

Supplement

A display device according to a first aspect is a display device including a plurality of subpixels each formed to have a light-emitting layer that is island-shaped, in which each of the plurality of subpixels has a first electrode, a cover film having an opening exposing the first electrode, the light-emitting layer, a second electrode, and a corresponding one of a plurality of subpixel circuits provided at intersection points of a plurality of data lines, a plurality of scanning signal lines, and a plurality of light emission control lines, the second electrode is common to a plurality of the first electrodes, the plurality of subpixels include a first subpixel including a first light-emitting layer, which is island-shaped, and a first subpixel circuit corresponding to the first light-emitting layer, a second subpixel including a second light-emitting layer, which is island-shaped, and a second subpixel circuit corresponding to the second light-emitting layer, a third subpixel including a third light-emitting layer, which is island-shaped, and a third subpixel circuit corresponding to the third light-emitting layer, and a fourth subpixel including a fourth light-emitting layer, which is island-shaped, and a fourth subpixel circuit corresponding to the fourth light-emitting layer, the first light-emitting layer and the second light-emitting layer are adjacent to each other in a column direction, the third light-emitting layer and the fourth light-emitting layer are adjacent to each other in the column direction, and the third light-emitting layer and the fourth light-emitting layer are adjacent to the first light-emitting layer and the second light-emitting layer in a diagonal direction, the third light-emitting layer and the fourth light-emitting layer have an identical light emission color, an area of the opening exposing the first electrode in the first subpixel is larger than an area of the opening exposing the first electrode in each of the second subpixel, the third subpixel, and the fourth subpixel, and the plurality of light emission control lines include a first light emission control line connected to the first subpixel circuit and the third subpixel circuit, and a second light emission control line adjacent to the first light emission control line and connected to the second subpixel circuit and the fourth subpixel circuit.

In a second aspect, the area of the opening exposing the first electrode in the first subpixel is equal to or less than a sum of the area of the opening exposing the first electrode in the second subpixel and the area of the opening exposing the first electrode in the fourth subpixel.

In a third aspect, a sum of the area of the opening exposing the first electrode in the first subpixel and the area of the opening exposing the first electrode in the third subpixel is equal to or less than a sum of the area of the opening exposing the first electrode in in the second subpixel and the area of the opening exposing the first electrode in the fourth subpixel.

In a fourth aspect, a sum of the area of the opening exposing the first electrode in the first subpixel and the area of the opening exposing the first electrode in the third subpixel is equal to a sum of the area of the opening exposing the first electrode in the second subpixel and the area of the opening exposing the first electrode in the fourth subpixel.

In a fifth aspect, the first electrode is an anode, and the second electrode is a cathode.

In a sixth aspect, the first light-emitting layer emits blue light.

In a seventh aspect, the second light-emitting layer emits red light, and the third light-emitting layer and the fourth light-emitting layer emit green light.

In an eighth aspect, the first light-emitting layer, the second light-emitting layer, the third light-emitting layer, and the fourth light-emitting layer have a square shape having diagonal lines parallel in a row direction and diagonal lines parallel in a column direction when seen in a plan view.

In a ninth aspect, the plurality of data lines include a first data line connected to the first subpixel circuit and the second subpixel circuit, and a second data line adjacent to the first data line and connected to the third subpixel circuit and the fourth subpixel circuit.

In a tenth aspect, the display device is an organic EL display.

The disclosure is not limited to the embodiments described above. Embodiments obtained by appropriately combining technical means disclosed in different embodiments also fall within the technical scope of the disclosure. Furthermore, novel technical features can be formed by combining the technical approaches disclosed in the embodiments.

The invention claimed is:

1. A display device comprising:
   a plurality of subpixels each formed to have a light-emitting layer having an island shape,
   wherein each of the plurality of subpixels has a first electrode, a cover film having an opening exposing the first electrode, the light-emitting layer, a second electrode, and a corresponding one of a plurality of subpixel circuits provided at intersection points of a plurality of data lines, a plurality of scanning signal lines, and a plurality of light emission control lines,
   the second electrode is common to a plurality of the first electrodes,
   the plurality of subpixels include a first subpixel including a first light-emitting layer, which is island-shaped, and a first subpixel circuit corresponding to the first light-emitting layer, a second subpixel including a second light-emitting layer, which is island-shaped, and a second subpixel circuit corresponding to the second light-emitting layer, a third subpixel including a third light-emitting layer, which is island-shaped, and a third subpixel circuit corresponding to the third light-emitting layer, and a fourth subpixel including a fourth light-emitting layer, which is island-shaped, and a fourth subpixel circuit corresponding to the fourth light-emitting layer,
   the first light-emitting layer and the second light-emitting layer are adjacent to each other in a column direction, the third light-emitting layer and the fourth light-emitting layer are adjacent to each other in the column direction, and the third light-emitting layer and the fourth light-emitting layer are adjacent to the first light-emitting layer and the second light-emitting layer in a diagonal direction,
   the third light-emitting layer and the fourth light-emitting layer have an identical light emission color,
   an area of the opening exposing the first electrode in the first subpixel is larger than an area of the opening exposing the first electrode in each of the second subpixel, the third subpixel, and the fourth subpixel, and
   the plurality of light emission control lines include a first light emission control line connected to the first subpixel circuit and the third subpixel circuit, and a second light emission control line adjacent to the first light emission control line and connected to the second subpixel circuit and the fourth subpixel circuit.

2. The display device according to claim 1, wherein the area of the opening exposing the first electrode in the first subpixel is equal to or less than a sum of the area of the opening exposing the first electrode in the second subpixel and the area of the opening exposing the first electrode in the fourth subpixel.

3. The display device according to claim 1, wherein a sum of the area of the opening exposing the first electrode in the first subpixel and the area of the opening exposing the first electrode in the third subpixel is equal to or less than a sum of the area of the opening exposing the first electrode in the second subpixel and the area of the opening exposing the first electrode in the fourth subpixel.

4. The display device according to claim 1, wherein a sum of the area of the opening exposing the first electrode in the first subpixel and the area of the opening exposing the first electrode in the third subpixel is equal to a sum of the area of the opening exposing the first electrode in the second subpixel and the area of the opening exposing the first electrode in the fourth subpixel.

5. The display device according to claim 1, wherein the first electrode is an anode, and the second electrode is a cathode.

6. The display device according to claim 1, wherein the first light-emitting layer emits blue light.

7. The display device according to claim 1, wherein the second light-emitting layer emits red light, and the third light-emitting layer and the fourth light-emitting layer emit green light.

8. The display device according to claim 1, wherein the first light-emitting layer, the second light-emitting layer, the third light-emitting layer, and the fourth light-emitting layer have a square shape having diagonal lines parallel in a row direction and diagonal lines parallel in a column direction when seen in a plan view.

9. The display device according to claim 1, wherein the plurality of data lines include a first data line connected to the first subpixel circuit and the second subpixel circuit, and a second data line adjacent to the first data line and connected to the third subpixel circuit and the fourth subpixel circuit.

10. The display device according to claim 1, wherein the display device is an organic EL display.

* * * * *